United States Patent
Kim

(10) Patent No.: US 11,037,653 B2
(45) Date of Patent: Jun. 15, 2021

(54) MEMORY DEVICES PERFORMING REPAIR OPERATIONS AND REPAIR OPERATION METHODS THEREOF

(71) Applicant: Samsung Electronics Co., Ltd., Suwon-si (KR)

(72) Inventor: Kyungryun Kim, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/593,023

(22) Filed: Oct. 4, 2019

(65) Prior Publication Data
US 2020/0111541 A1    Apr. 9, 2020

(30) Foreign Application Priority Data

Oct. 5, 2018 (KR) .................. 10-2018-0119318
Jul. 12, 2019 (KR) .................. 10-2019-0084541

(51) Int. Cl.
| G11C 7/00 | (2006.01) |
| G11C 29/00 | (2006.01) |
| G11C 8/10 | (2006.01) |

(52) U.S. Cl.
CPC ............ *G11C 29/88* (2013.01); *G11C 8/10* (2013.01)

(58) Field of Classification Search
CPC ... G11C 29/808; G11C 29/785; G11C 29/846; G11C 29/848; H05K 999/99
USPC ............................................. 365/200, 225.7
See application file for complete search history.

(56) References Cited

U.S. PATENT DOCUMENTS

| 5,270,975 A | 12/1993 | McAdams | |
| 6,587,386 B2 | 7/2003 | Blodgett | |
| 6,788,597 B2 | 9/2004 | Ladner et al. | |
| 6,985,392 B2 | 1/2006 | Bateman et al. | |
| 9,046,573 B1 * | 6/2015 | Watt ..................... | G11C 29/006 |
| 2003/0031061 A1 | 2/2003 | Kwon | |
| 2005/0099861 A1 | 5/2005 | Mohr et al. | |
| 2008/0266990 A1 * | 10/2008 | Loeffler ............... | G11C 29/808 365/201 |
| 2011/0209011 A1 | 8/2011 | Mohr et al. | |
| 2019/0096508 A1 | 3/2019 | Kim et al. | |

* cited by examiner

*Primary Examiner* — Son T Dinh
(74) *Attorney, Agent, or Firm* — Myers Bigel, P.A.

(57) ABSTRACT

A memory device includes: a memory cell array including a plurality of memory regions, the plurality of memory regions including first and second edge memory regions each respectively including an edge word line, and the plurality of memory regions including a center memory region including a center word line; a segment selection circuit configured to select a target segment from among a plurality of segments based on an input row address and output segment information identifying the target segment, where the first and second edge memory regions and the center memory region are grouped into a first segment of the plurality of segments; and a column decoder configured to control a column repair operation performed on a segment basis based on at least one fuse set that is selected based on the segment information.

20 Claims, 16 Drawing Sheets

FIG. 4

| Segment | Memory Region |
|---|---|
| SEG1 & SEG8 | First Edge Memory Region |
| SEG1 | IMG_L_1 |
| SEG2 | IMG_L_2 |
| | IMG_L_3 |
| | IMG_L_4 |
| SEG3 | IMG_L_5 |
| | IMG_L_6 |
| | IMG_L_7 |
| SEG4 | IMG_L_8 |
| | IMG_L_9 |
| SEG4 & SEG5 | Center Memory Region |
| SEG5 | IMG_R_9 |
| | IMG_R_8 |
| SEG6 | IMG_R_7 |
| | IMG_R_6 |
| | IMG_R_5 |
| SEG7 | IMG_R_4 |
| | IMG_R_3 |
| | IMG_R_2 |
| SEG8 | IMG_R_1 |
| SEG8 & SEG1 | Second Edge Memory Region |

FIG. 5

| Segment | Memory Region |
|---|---|
| SEG1 | First Edge Memory Region |
| SEG2 | IMG_L_1 |
| | IMG_L_2 |
| | IMG_L_3 |
| SEG3 | IMG_L_4 |
| | IMG_L_5 |
| | IMG_L_6 |
| SEG4 | IMG_L_7 |
| | IMG_L_8 |
| | IMG_L_9 |
| SEG1 | Center Memory Region |
| SEG5 | IMG_R_9 |
| | IMG_R_8 |
| | IMG_R_7 |
| SEG6 | IMG_R_6 |
| | IMG_R_5 |
| | IMG_R_4 |
| SEG7 | IMG_R_3 |
| | IMG_R_2 |
| | IMG_R_1 |
| SEG1 | Second Edge Memory Region |

FIG. 6A

| Segment | Memory Region |
|---|---|
| SEG1 | First Edge Memory Region |
| SEG2 | IMG_L_1 |
|  | IMG_L_2 |
|  | IMG_L_3 |
| SEG3 | IMG_L_4 |
|  | IMG_L_5 |
|  | IMG_L_6 |
| SEG4 | IMG_L_7 |
|  | IMG_L_8 |
| SEG1 | Center Memory Region |
| SEG5 | IMG_R_8 |
|  | IMG_R_7 |
| SEG6 | IMG_R_6 |
|  | IMG_R_5 |
|  | IMG_R_4 |
| SEG7 | IMG_R_3 |
|  | IMG_R_2 |
|  | IMG_R_1 |
| SEG1 | Second Edge Memory Region |

FIG. 6B

| Segment | Memory Region |
|---|---|
| SEG1 | First Edge Memory Region |
| SEG2 | IMG_L_1 |
| | IMG_L_2 |
| | IMG_L_3 |
| SEG3 | IMG_L_4 |
| | IMG_L_5 |
| | IMG_L_6 |
| SEG4 | IMG_L_7 |
| SEG1 | Center Memory Region |
| SEG5 | IMG_R_7 |
| SEG6 | IMG_R_6 |
| | IMG_R_5 |
| | IMG_R_4 |
| SEG7 | IMG_R_3 |
| | IMG_R_2 |
| | IMG_R_1 |
| SEG1 | Second Edge Memory Region |

FIG. 6C

| Segment | Memory Region |
|---|---|
| SEG1 | First Edge Memory Region |
| SEG2 | IMG_L_1 |
| | IMG_L_2 |
| | IMG_L_3 |
| SEG3 | IMG_L_4 |
| | IMG_L_5 |
| SEG4 | IMG_L_6 |
| | IMG_L_7 |
| SEG1 | Center Memory Region |
| SEG5 | IMG_R_7 |
| | IMG_R_6 |
| SEG6 | IMG_R_5 |
| | IMG_R_4 |
| SEG7 | IMG_R_3 |
| | IMG_R_2 |
| | IMG_R_1 |
| SEG1 | Second Edge Memory Region |

FIG. 7

| Segment | Memory Region |
|---|---|
| SEG1 | First Edge Memory Region |
| | IMG_L_1 |
| SEG2 | IMG_L_2 |
| | IMG_L_3 |
| | IMG_L_4 |
| | IMG_L_5 |
| | IMG_L_6 |
| SEG3 | IMG_L_7 |
| | IMG_L_8 |
| SEG1 | Center Memory Region |
| SEG4 | IMG_R_8 |
| | IMG_R_7 |
| SEG5 | IMG_R_6 |
| | IMG_R_5 |
| | IMG_R_4 |
| | IMG_R_3 |
| | IMG_R_2 |
| SEG1 | IMG_R_1 |
| | Second Edge Memory Region |

MEMORY DEVICES PERFORMING REPAIR OPERATIONS AND REPAIR OPERATION METHODS THEREOF

CROSS-REFERENCE TO RELATED APPLICATIONS

This application claims the benefit of priority to Korean Patent Application No. 10-2018-0119318, filed on Oct. 5, 2018 in the Korean Intellectual Property Office, and to Korean Patent Application No. 10-2019-0084541, filed on Jul. 12, 2019 in the Korean Intellectual Property Office, the disclosures of which are incorporated by reference herein in their entireties.

TECHNICAL FIELD

The present disclosure relates to memory devices and to repair operation methods of the memory devices, and more particularly, to memory devices performing repair operations and to repair operation methods of the memory devices.

BACKGROUND

Mobile-oriented memory devices such as low power double data rate (LPDDR) synchronous dynamic random access memory (SDRAM) are typically used in mobile electronic devices such as smartphones, tablet personal computers (PCs), and ultra books. Along with desired increases in capacity of memory devices, for example to support an increase in size of mobile operating systems (OS) to support functionality such as multitasking, memory devices for mobile electronic devices that have operation performance with increasing speed and reduced power consumption characteristics desired.

Additionally, in some memory devices, a technique of replacing a defective cell with a normal cell may be used, and this technique may be referred to as a repair operation. Some methods for improving a yield of such repair operations have been initially researched.

SUMMARY

The present disclosure provides apparatuses and methods for performing a repair operation that avoid an unnecessary forced repair situation and thereby improve yield.

According to some aspects of the inventive concepts, there is provided a memory device including: a memory cell array including a plurality of memory regions having first and second edge memory regions respectively including edge word lines and a center memory region including a center word line; a segment selection circuit configured to select a target segment from among a plurality of segments based on a row address and output segment information identifying the target segment, wherein the first and second edge memory regions and the center memory region are grouped into a first segment; and a column decoder configured to control a column repair operation performed on a segment basis based on at least one fuse set that is selected based on the segment information.

According to some aspects of the inventive concepts, there is provided a memory device including: a memory cell array including a plurality of memory regions; a first column decoder on a first side of the memory cell array; and a second column decoder on a second side of the memory cell array opposite from the first side, wherein the plurality of memory regions include: a first edge memory region nearest to the first column decoder; a second memory region nearest to the second column decoder; and a center memory region located between the first edge memory region and the second memory region at a center of the memory cell array. The first column decoder and the second column decoder are each configured to repair a bit line by connecting the first edge memory region, the second memory region, and the center memory region to a spare bit line based on detecting a memory cell included in at least one among the first edge memory region, the second memory region, and the center memory region is defective.

According to some aspects of the inventive concepts, there is provided a repair operation method of a memory device, the repair operation method including: grouping into a first segment a first edge memory block including a first edge word line, a second edge memory block including a second edge word line, and a center memory block including a center word line; grouping into a plurality of second segments a plurality of intermediate memory blocks wherein the first edge memory block, the second edge memory block, and the center memory block are excluded from the plurality of second segments; and performing a column repair operation for a defective cell on a segment basis based on selecting one of the first segment or one of the plurality of second segments.

According to some aspects of the inventive concepts, there is provided a memory device including: a memory cell array including a plurality of memory blocks including a first number of memory blocks; a segment selection circuit configured to group the plurality of memory blocks into a plurality of segments including a second number of segments, wherein the second number is less than the first number, and wherein the segment selection circuit is configured to select, based on an input row address, a target segment from among the plurality of segments and output segment information identifying the target segment; and a repair circuit configured to control a column repair operation on a segment basis using at least one fuse set corresponding to the segment information, wherein the segment selection circuit is further configured to group into a first segment a first memory block and a second memory block non-adjacent to each other within the memory cell array.

According to some aspects of the inventive concepts, there is provided a column repair method of a memory device including a plurality of memory blocks, the plurality of memory blocks including first and second edge memory blocks respectively including edge word lines, a center memory block including a center word line, and a plurality of intermediate memory blocks, the column repair method including: performing a column repair operation on both the first and second edge memory blocks and the center memory block in response to a defect in a cell included in at least one of the first edge memory block, the second edge memory block, and the center memory block; and performing the column repair operation on both a first memory block included in the plurality of intermediate memory blocks and a predetermined number of memory blocks adjacent to the first memory block in response to a defect in a cell included in the first memory block.

BRIEF DESCRIPTION OF THE DRAWINGS

Aspects of the present disclosure will be more clearly understood from the following detailed description taken in conjunction with the accompanying drawings in which:

FIG. 4 is a table illustrating a grouping of memory regions according to a comparative example;

FIG. 5 is a table illustrating a grouping of memory regions according to some embodiment of the inventive concepts;

FIGS. 6A to 6C are tables illustrating groupings of memory regions according to some embodiments of the inventive concepts;

FIG. 7 is a table illustrating a grouping of memory regions according to some embodiments of the inventive concepts;

DETAILED DESCRIPTION

Hereinafter, some embodiments of the inventive concepts will be described in detail with reference to the accompanying drawings.

Figure 1:
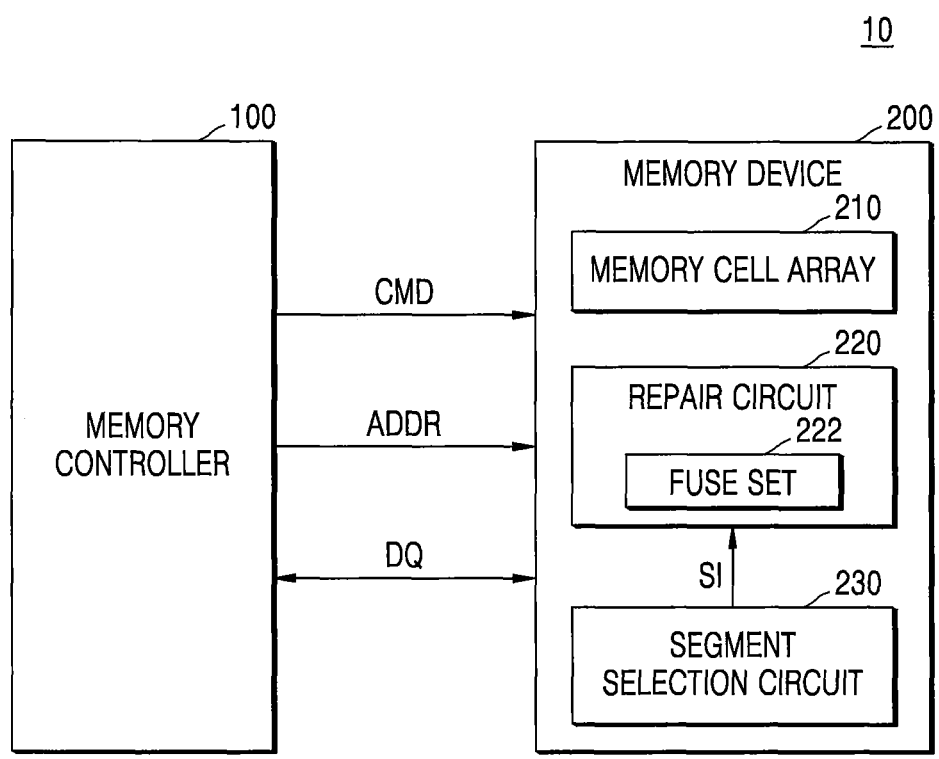
FIG. 1 is a block diagram of a memory system according to some embodiments of the inventive concepts.

FIG. 1 is a block diagram of a memory system 10 according to some embodiments of the inventive concepts. The memory system 10 may include a memory controller 100 and a memory device 200. The memory system 10 may be implemented in and/or included in a personal computer (PC) or a mobile electronic device. The mobile electronic device may be a laptop computer, a mobile phone, a smartphone, a tablet PC, a personal digital assistant (PDA), an enterprise digital assistant (EDA), a digital still camera, a digital video camera, a portable multimedia player, (PMP), a personal navigation device or portable navigation device (PND), a handheld game console, a mobile Internet device (MID), a wearable computer, an Internet of Things (IoT) device, an Internet of Everything (IoE) device, or a drone, as examples.

The memory controller 100 may be implemented by an integrated circuit (IC), a system on chip (SoC), an application processor (AP), a mobile AP, a chipset, or a set of chips. For example, the memory controller 100 may be a semiconductor device configured to perform a memory control function, and the memory controller 100 may also be included in an AP. For example, the AP may include the memory controller 100, random access memory (RAM), a central processing unit (CPU), a graphics processing unit (GPU), and/or a modem.

In some embodiments, the memory device 200 may be implemented by a volatile memory device. The volatile memory device may be implemented by RAM, dynamic random access memory (DRAM), or static random access memory (SRAM), but is not limited thereto. For example, the memory device 200 may correspond to double data rate synchronous dynamic random access memory (DDR SDRAM), lower power double data rate (LPDDR), SDRAM, graphics double data rate (GDDR) SDRAM, Rambus dynamic random access memory (RDRAM), or the like. The memory device 200 may be implemented by a high bandwidth memory (HBM).

In some embodiments, the memory device 200 may be implemented by a nonvolatile memory device. For example, the memory device 200 may be implemented by resistive memories such as phase change random access memory (PRAM), magnetic random access memory (MRAM), resistive random access memory (RRAM), or the like.

The memory controller 100 may control the memory device 200 in response to a write/read request from a host, such that data DQ stored in the memory device 200 is read, or the data DQ is written in the memory device 200. In detail, the memory controller 100 may control operations of writing and reading the data DQ in and from the memory device 200 by providing an address ADDR and a command CMD to the memory device 200. In addition, the data DQ to be written and the read data DQ may be transmitted and received between the memory controller 100 and the memory device 200.

The memory device 200 may include a memory cell array 210, a repair circuit 220, and a segment selection circuit 230.

The memory cell array 210 may include a plurality of memory cells, and as an example, the memory cell array 210 may include a plurality of memory cells arranged in a region in which a plurality of rows and a plurality of columns intersect. The plurality of memory cells in the memory cell array 210 may be indicated by the address ADDR, and the address ADDR may include a plurality of bits for indicating the plurality of memory cells. According to some embodiments of the inventive concepts, the address ADDR may include a row address and a column address.

The memory cell array 210 may include or over time develop a defective cell due to various causes such as a manufacturing process, and the repair circuit 220 may be configured to replace the defective cell with a normal cell by performing a repair operation. For example, the memory device 200 or the repair circuit 220 may include an address converter configured to convert an address indicating a defective cell into an address indicating a normal cell, and when an address ADDR that indicates a defective cell is received from the host, the memory device 200 may convert the address ADDR into an address that indicates a normal cell.

According to some embodiments of the inventive concepts, the repair circuit 220 may include a storage circuit configured to store information about a plurality of bits for a repair operation. For example, the repair circuit 220 may include a fuse set 222 storing information about a plurality of bits. In some embodiments of the inventive concepts, the repair circuit 220 may include a plurality of fuse sets. Although the present specification illustrates a fuse set as a storage circuit, other various types of storage circuits may be applied instead.

According to some embodiments of the inventive concepts, the memory cell array 210 may include a plurality of memory regions. Each of the plurality of memory regions may include memory cells connected to a plurality of word lines. For example, each of the plurality of memory regions may be a memory block. However, the plurality of memory regions are not limited thereto, and for example, each of the plurality of memory regions may be a sub-memory block.

The plurality of word lines connected to the memory cell array 210 may include edge word lines at first and second ends thereof and include a center word line at the center thereof. The edge word lines may include a first edge word line located at the first end, which is in a first direction from the center of the plurality of word lines, and a second edge word line located at the second end, which is in a second direction from the center of the plurality of word lines The plurality of memory regions may include edge memory regions respectively including the edge word lines. In other words, the edge memory regions may include a first edge memory region including the first edge word line and a second edge memory region including the second edge word line. The plurality of memory regions may also include a center memory region including the center word line.

When a repair operation (or a column repair operation) is performed on the memory cell array 210, the repair circuit 220 may perform the repair operation on a segment basis. In other words, a segment may indicate a unit on which a repair operation is performed or to be performed. The memory cells included in the memory cell array 210 may be divided or grouped into a plurality of segments.

According to some embodiments of the inventive concepts, each of the plurality of segments may include at least one memory region. For example, each of the plurality of segments may include at least one memory block. According to some embodiments of the inventive concepts, each of the plurality of segments may include an equal number of memory blocks, as shown in FIG. 5. However, the present disclosure is not limited thereto, and in some embodiments of the inventive concepts, at least one of the plurality of segments may include a different number of memory blocks as compared to the other segments, for example as shown in FIGS. 6A to 6C and 7.

In the memory system 10 according to some embodiments of the inventive concepts, the plurality of memory regions may be grouped such that a first memory region and a second memory region, which are not adjacent to each other within the memory cell array 210, are included in one segment.

For example, in the memory system 10 according to some embodiments of the inventive concepts, the edge memory regions (that is, the first and second edge memory regions) and the center memory region included in the memory cell array 210 may be included in one segment. In other words, the first and second edge memory regions and the center memory region may be grouped to be included in a same segment. Accordingly, because a repair operation of the memory device 200 is performed on a segment basis, a single instantiation of the repair operation may result in the repair operation being performed on both of the first and second edge memory regions and on the center memory region.

The segment selection circuit 230 may be configured to select at least one of the plurality of segments based on a row address included in the address ADDR provided from the memory controller 100. For example, the segment selection circuit 230 may output segment information SI about a target segment including a selected word line, based on the row address. The segment selection circuit 230 may provide the segment information SI to the repair circuit 220. To this end, according to some embodiments of the inventive concepts, the segment selection circuit 230 may store information indicating a segment in which each of the plurality of memory regions is included. For example, the segment selection circuit 230 may store grouping information regarding the plurality of memory regions and may generate the segment information SI based on the stored grouping information. The grouping information may have a form of a look-up table. The segment selection circuit 230 will be described in greater detail herein with reference to FIGS. 8 to 10.

According to some embodiments of the inventive concepts, the repair circuit 220 may select a fuse set corresponding to the target segment from among the plurality of fuse sets based on the segment information SI provided from the segment selection circuit 230, and the repair circuit 220 may control a repair operation based on the selected fuse set.

By grouping the edge memory regions and the center memory region into one segment, unnecessary forced repair situations which may occur in the comparative example to be described with reference to FIG. 4 may not occur in memory systems according to the inventive concepts, or may occur less frequently. Accordingly, in the memory system 10 according to some embodiments of the inventive concepts, a yield of the memory device 200 may increase.

Figure 2:
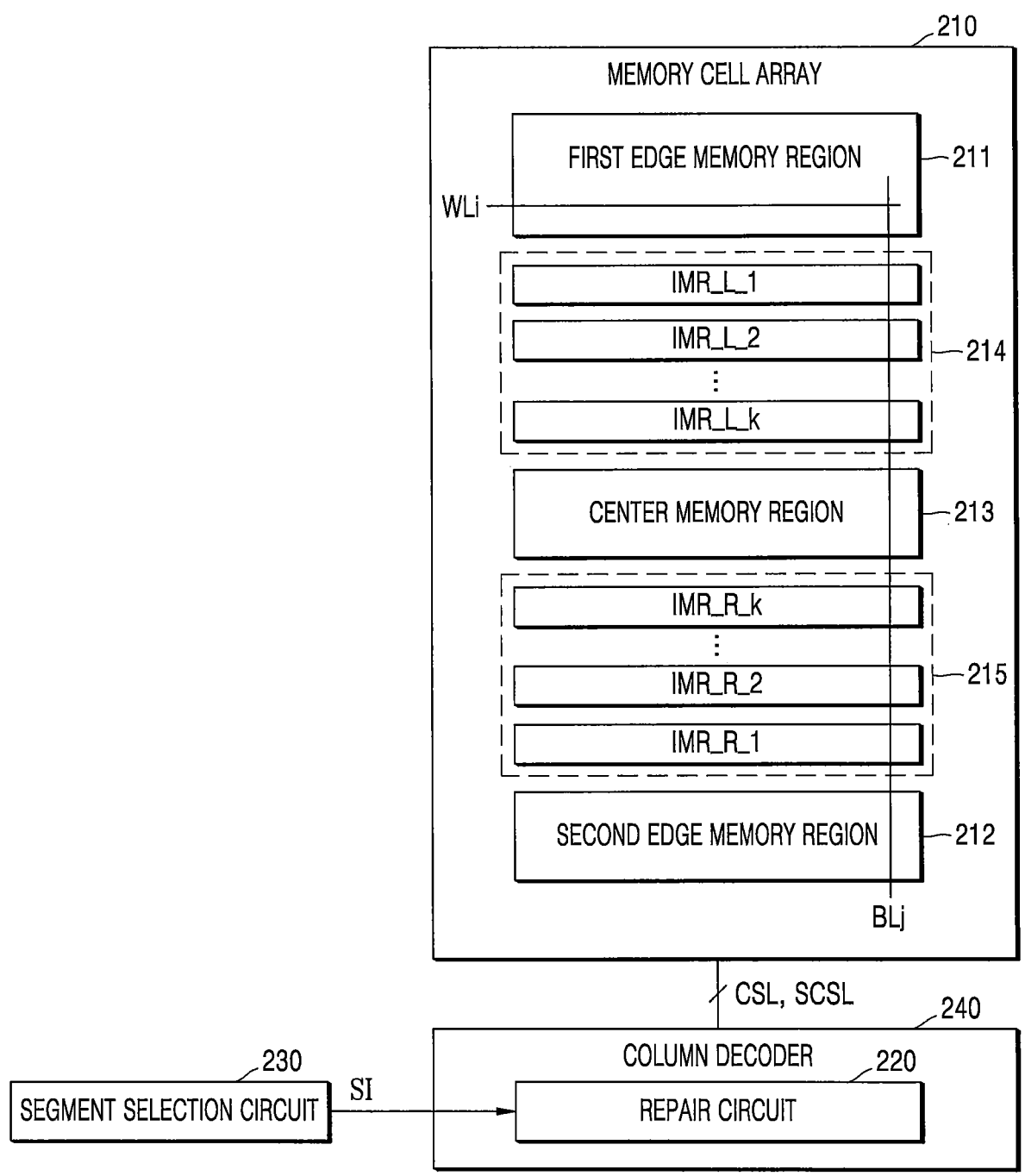
FIG. 2 is a block diagram of a memory device according to some embodiments of the inventive concepts.

FIG. 2 is a block diagram of the memory device 200 according to an example embodiment of the inventive concept. The memory device 200 may include the memory cell array 210, the segment selection circuit 230, and a column decoder 240. The overlapping portions of the description of the memory device 200 made with reference to FIG. 1 are not repeated herein for brevity.

The memory cell array 210 may include a plurality of memory cells located in a region in which a plurality of word lines and a plurality of bit lines intersect. For example, a memory cell may be located in a region in which a word line WLi and a bit line BLj intersect. In FIG. 2, only a single word line WLi and bit line BLj are illustrated for ease of understanding.

According to some embodiments of the inventive concepts, the memory cell array 210 may have an open bit line structure.

The memory cell array 210 may include a plurality of memory regions. For example, the memory cell array 210 may include a first edge memory region 211 including a first edge word line, and the first edge memory region 211 may be located at a end first end of the memory cell array 210, which may be in a first direction from the center of the memory cell array 210. The memory cell array 210 may also include a second edge memory region 212 including a second edge word line, and the second edge memory region 212 may be located at a second end of the memory cell array 210, which may be located in a second direction from the center of the memory cell array 210. The second direction may be opposite from the first direction. A center memory region 213 including a center word line may be located at a central portion of the memory cell array 210. The memory cell array 210 may also include a plurality of intermediate memory regions. For example, the memory cell array 210 may include first intermediate memory regions 214 located between the first edge memory region 211 and the center memory region 213, and may include second intermediate memory regions 215 located between the second edge memory region 212 and the center memory region 213. Each of the first intermediate memory regions 214 and the second intermediate memory regions 215 may include k intermediate memory regions, where k is a natural number.

As described below with reference to FIGS. 5 to 7, the first edge memory region 211, the second edge memory region 212, and the center memory region 213 may be grouped into one segment. For example, the first edge memory region 211, the second edge memory region 212, and the center memory region 213 may be grouped into a first segment. According to some embodiments of the inventive concepts, the plurality of intermediate memory regions may be grouped into a plurality of second segments. Segment grouping is described in greater detail herein with reference to FIGS. 5 to 7.

The segment selection circuit 230 may be configured to output segment information SI about a target segment including a selected word line based on an input row address. The segment selection circuit 230 will be described in greater detail herein with reference to FIGS. 8 to 10.

The column decoder 240 may be connected to the memory cell array 210 through column select lines CSL and spare column select lines SCSL. The column decoder 240 may select the column select lines CSL and/or the spare column select lines SCSL based on a write command or a read command. When the column decoder 240 selects at least one of the column select lines CSL, bit lines may be selected. Likewise, when the column decoder 240 selects at least one of the spare column select lines SCSL, spare bit lines may be selected. The bit lines and the spare bit lines will be described in greater detail below with reference to FIG. 3.

Figure 3:
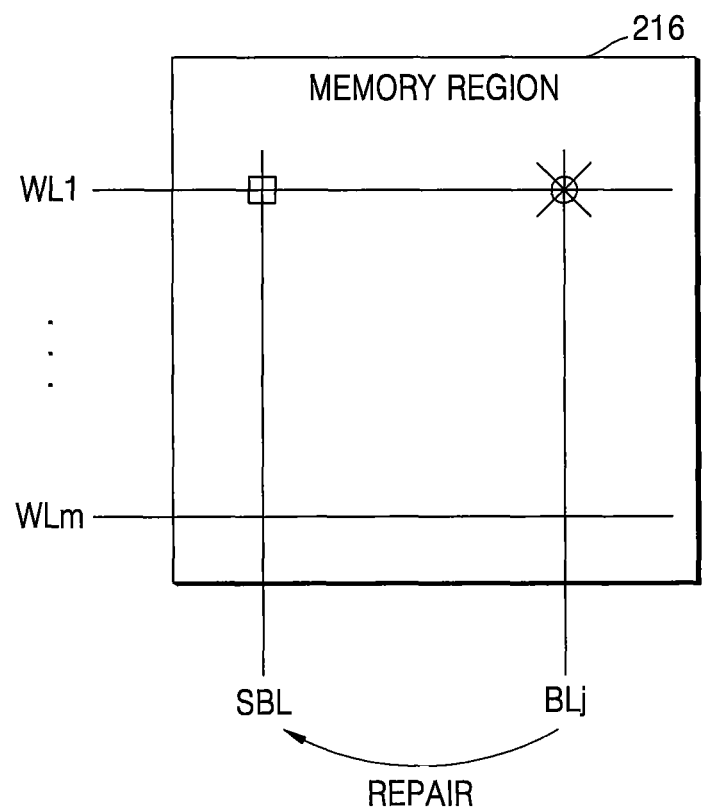
FIG. 3 illustrates a memory region according to some embodiments of the inventive concepts.

FIG. 3 illustrates a memory region 216 according to some embodiments of the inventive concepts. At least one of the first edge memory region 211, the second edge memory region 212, the center memory region 213, and the plurality of intermediate memory regions in FIG. 2 may correspond to the memory region 216 illustrated in FIG. 3.

The memory region 216 may include a plurality of memory cells connected to a plurality of word lines WL1 to WLm. The memory region 216 may include a normal memory cell region and a spare memory cell region. The normal memory cell region may indicate a region in which normal data is stored. The spare memory cell region may indicate a memory cell region to be used for a repair when a memory cell included in the normal memory cell region is or becomes defective.

For example, the memory region 216 may be connected to at least one spare bit line and a plurality of bit lines. The spare memory cell region may include memory cells connected to the at least one spare bit line among the memory cells included in the memory region 216. The normal memory cell region may include memory cells connected to the bit lines among the memory cells included in the memory region 216.

In FIG. 3, it is assumed that a memory cell connected to a bit line BLj is defective as indicated by 'X'. In this case, a memory device may repair the bit line BLj to which the defective memory cell is connected by connecting the word line connected to the defective bit line BLj to one spare bit line SBL among the at least one spare bit line. The memory device may perform a repair operation in the manner described above, and this operation of repairing a column may be referred to as a column repair operation.

Referring back to FIG. 2, the column decoder 240 may include the repair circuit 220. The repair circuit 220 may select one of the plurality of fuse sets based on the segment information SI provided from the segment selection circuit and may control a repair operation based on the selected fuse set. For example, the repair circuit 220 may control a connection between the column decoder 240 and the memory cell array 210 based on the segment information SI, a column address, or the like.

By grouping the first edge memory region 211, the second edge memory region 212, and the center memory region 213 into one segment, unnecessary forced repair situations which may occur in the comparative example to be described with reference to FIG. 4 may not occur in the memory device 200 according to the inventive concepts, or may occur less frequently. Accordingly, a yield of the memory device 200 according to an example embodiment of the inventive concept may increase.

FIG. 4 is a table illustrating a grouping of memory regions according to a comparative example. FIG. 4 illustrates a case where a memory cell array includes 21 memory regions, but the number of memory regions, the number of segments, and the number of memory regions included in one segment are only for convenience of description and are not limited thereto.

In the comparative example, a first segment SEG1 includes a first edge memory region, a second edge memory region, and an intermediate memory region IMG_L_1. A fourth segment SEG4 includes intermediate memory regions IMG_L_8 and IMG_L_9 and a center memory region, and a fifth segment SEG5 includes intermediate memory regions IMG_R_8 and IMG_R_9 and the center memory region. An eighth segment SEG8 includes the first edge memory region, the second edge memory region, and an intermediate memory region IMG_R_1.

According to the comparative example, because the first edge memory region is included in the first segment SEG1 and in the eighth segment SEG8, when a defect occurs in a memory cell included in the first edge memory region, a repair operation is performed in both the first segment SEG1 and the eighth segment SEG8. Likewise, because the second edge memory region is included in the first segment SEG1 and in the eighth segment SEG8, when a defect occurs in a memory cell included in the second edge memory region, a repair operation is performed in both the first segment SEG1 and the eighth segment SEG8. Likewise, as the center memory region is included in the fourth segment SEG4 and the fifth segment SEG5, when a defect occurs in a memory cell included in the center memory region, a repair operation is performed in both the fourth segment SEG4 and the fifth segment SEG5.

As described above, in the comparative example, even when a defect occurs in only one memory region or one memory block, a forced repair situation may occur in which a repair operation is performed on two segments. Particularly, because the forced repair is an unnecessary forced repair, a yield may decrease in the comparative example.

FIG. 5 is a table illustrating a grouping of memory regions according to some embodiments of the inventive concepts. FIG. 5 shows a case where a memory cell array includes 21 memory regions, but the number of memory regions, the number of segments, and the number of memory regions included in one segment are only for convenience of description and are not limited thereto.

Particularly, FIG. 5 shows an embodiment in which an equal number of memory regions are included in each segment.

According to some embodiments of the inventive concepts, a first edge memory region, a second edge memory region, and a center memory region may be included in one segment. For example, the first edge memory region, the second edge memory region, and the center memory region may be included in a first segment SEG1.

A plurality of intermediate memory regions IMG_L_1 to IMG_L_9 and IMG_R_1 to IMG_R_9 may be grouped into second segment SEG2 to seventh segment SEG7.

For example, the second segment SEG2 may include intermediate memory regions IMG_L_1, IMG_L_2, and IMG_L_3, the third segment SEG3 may include intermediate memory regions IMG_L_4, IMG_L_5, and IMG_L_6, the fourth segment SEG4 may include intermediate memory regions IMG_L_7, IMG_L_8, and IMG_L_9, the fifth segment SEG5 may include intermediate memory regions IMG_R_7, IMG_R_8, and IMG_R_9, the sixth segment SEG6 may include intermediate memory regions IMG_R_4, IMG_R_5, and IMG_R_6, and the seventh segment SEG7 may include intermediate memory regions IMG_R_1, IMG_R_2, and IMG_R_3.

In the segment grouping according to some embodiments of the inventive concepts, when a defect occurs in a memory cell included in any one of the first edge memory region, the second edge memory region, and the center memory region, a repair operation may be performed on only the first segment SEG1, and thus, an unnecessary forced repair situation may not occur. Accordingly, a yield of a memory device may increase.

FIGS. 6A to 6C are tables illustrating groupings of memory regions according to some embodiments of the inventive concepts. FIGS. 6A to 6C shows embodiments in which memory regions are grouped such that most segments include a first number of memory regions, but the total number of memory regions is not a multiple of the first number. For convenience of description, in FIGS. 6A to 6C it is assumed that the first number is 3, but the present disclosure is not limited thereto. In addition, for convenience of description and in the interest of brevity, differences of FIGS. 6A to 6C from FIG. 5 will be mainly described.

Referring to FIG. 6A, the number of memory regions included in a first segment SEG1 may differ from the number of memory regions included in each of a fourth segment SEG4 and a fifth segment SEG5. For example, the first segment SEG1 includes three memory regions including a first edge memory region, a second edge memory region, and a center memory region, whereas the fourth segment SEG4 may include two intermediate memory regions IMG_L_7 and IMG_L_8, and the fifth segment SEG5 may include two intermediate memory regions IMG_R_7 and IMG_R_8.

Referring to FIG. 6B, the number of memory regions included in a first segment SEG1 may differ from the number of memory regions included in each of a fourth segment SEG4 and a fifth segment SEG5. For example, the first segment SEG1 includes three memory regions including a first edge memory region, a second edge memory region, and a center memory region, whereas the fourth segment SEG4 may include one intermediate memory region IMG_L_7, and the fifth segment SEG5 may include one intermediate memory region IMG_R_7.

Referring to FIG. 6C, the number of memory regions included in a first segment SEG1 may differ from the number of memory regions included in each of a third segment SEG3, a fourth segment SEG4, a fifth segment SEG5, and a sixth segment SEG6. For example, the first segment SEG1 includes three memory regions including a first edge memory region, a second edge memory region, and a center memory region, whereas the third segment SEG3 may include two intermediate memory regions IMG_L_4 and IMG_L_5, the fourth segment SEG4 may include two intermediate memory regions IMG_L_6 and IMG_L_7, the fifth segment SEG5 may include two intermediate memory regions IMG_R_6 and IMG_R_7, and the sixth segment SEG6 may include two intermediate memory regions IMG_R_4 and IMG_R_5.

FIG. 7 is a table illustrating a grouping of memory regions according to some embodiments of the inventive concepts. Particularly, FIG. 7 shows an embodiment whereby one segment includes five memory regions. The present disclosure is not limited to any particular number of memory regions that are grouped into a single segment, and in some embodiments the memory regions are grouped such that one segment includes four, five, or more than five memory regions, and/or grouped such that one segment includes one, two, or three memory regions, as already seen in FIGS. 5 and 6A to 6C.

In the example of FIG. 7, a first segment SEG1 may include the first edge memory region, the second edge memory region, and the center memory region. Furthermore, the first segment SEG1 may further include intermediate memory regions IMG_L_1 and IMG_R_1. A second segment SEG2 may include intermediate memory regions IMG_L_2, IMG_L_3, IMG_L_4, IMG_L_5, and IMG_L_6, and a fifth segment SEG5 may include intermediate memory regions IMG_R_2, IMG_R_3, IMG_R_4, IMG_R_5, and IMG_R_6.

A third segment SEG3 and a fourth segment SEG4 may include a smaller number of memory regions than the number of memory regions included in the first segment SEG1. For example, the first segment SEG1 includes five memory regions, whereas the third segment SEG3 may include two intermediate memory regions IMG_L_7 and IMG_L_8, and the fourth segment SEG4 may include two intermediate memory regions IMG_R_7 and IMG_R_8.

Figure 8:
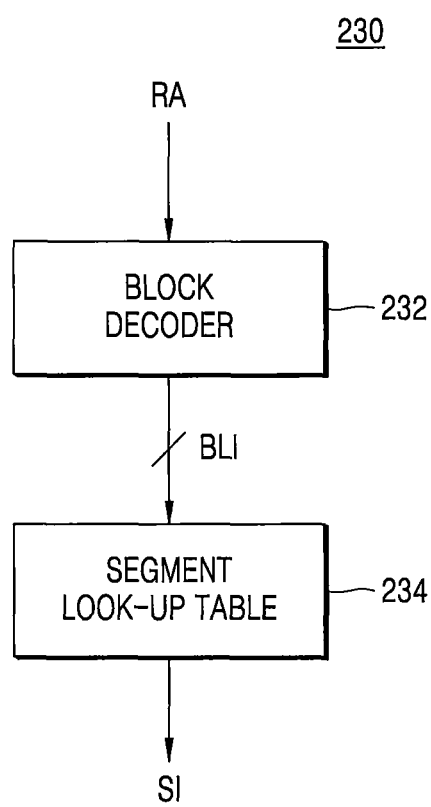
FIG. 8 is a block diagram of a segment selection circuit according to some embodiments of the inventive concepts.

FIG. 8 is a block diagram of the segment selection circuit 230 according to some embodiments of the inventive concepts. The segment selection circuit 230 may output segment information SI based on an input row address RA. Previous description of the segment selection circuit 230 made with reference to FIGS. 1 and 2 is not repeated herein for brevity.

The segment selection circuit 230 may include a block decoder 232 and a segment look-up table 234.

The block decoder 232 may output block information BLI including information about a memory block including a selected word line, based on the input row address RA. According to some embodiments of the inventive concepts, the block decoder 232 may generate and output the block information BLI indicating a memory block including the selected word line by decoding the input row address RA. The block decoder 232 may provide the block information BLI to the segment look-up table 234.

The segment look-up table 234 may output segment information SI including information about a segment including the selected word line based on the block information BLI provided from the block decoder 232. According to some embodiments of the inventive concepts, the segment look-up table 234 may store, as grouping information, such a look-up table as shown in FIGS. 5 to 7 and output the segment information SI indicating a segment including the selected word line based on the grouping information and the block information BLI. The segment look-up table 234 may provide the segment information SI to a repair circuit, such as repair circuit 220 of FIGS. 1 and 2.

Figure 10:
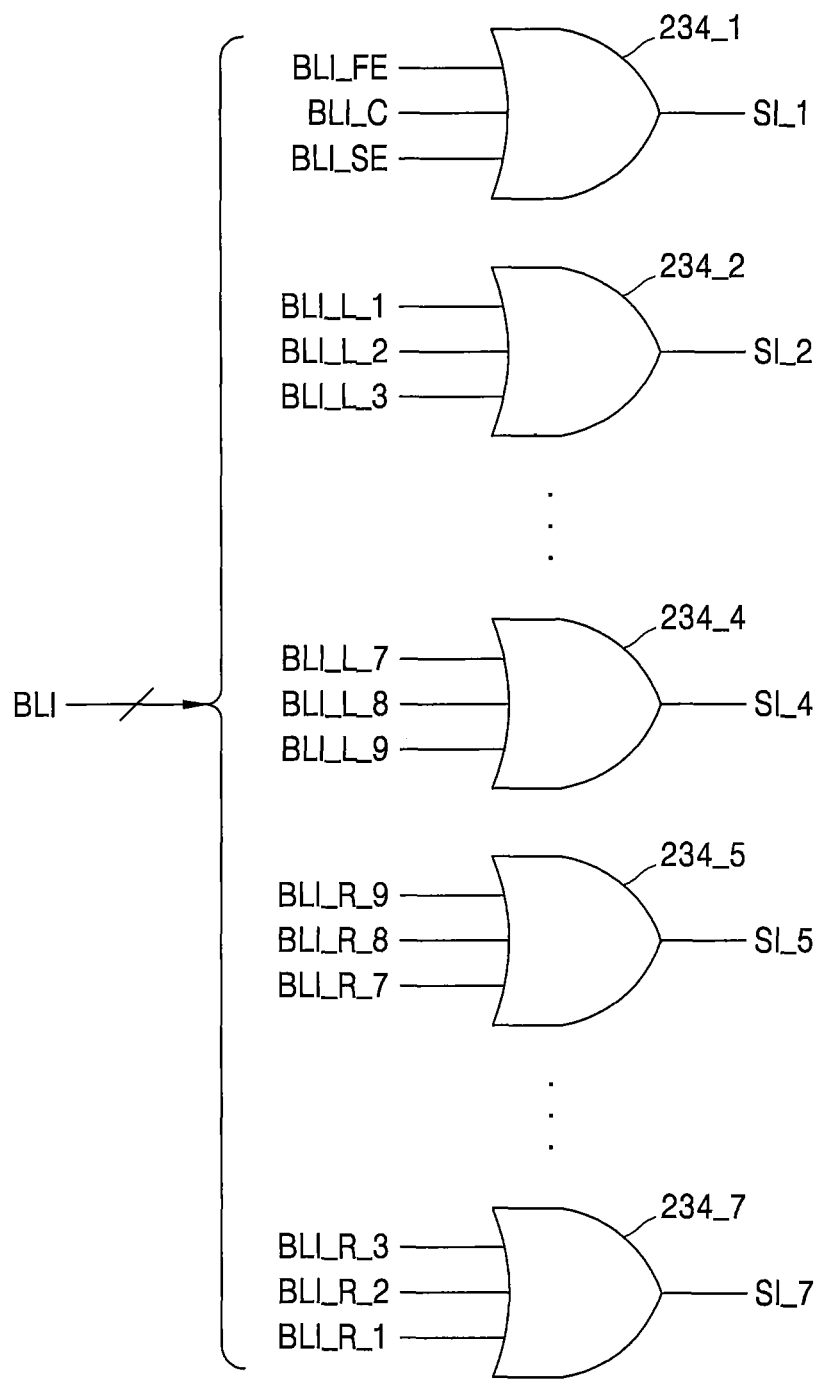
FIG. 10 is a logic diagram of a segment look-up table according to some embodiments of the inventive concepts.

The segment look-up table 234 may be implemented in various forms, and according to an example embodiment of the inventive concept, the segment look-up table 234 may be implemented in hardware form or in software form. When the segment look-up table 234 is implemented in hardware form, the segment look-up table 234 may include circuits configured to generate the segment information SI, and according to some embodiments of the inventive concepts, the segment look-up table 234 may be implemented as shown in FIG. 10. When the segment look-up table 234 is implemented in software form, the segment information SI may be generated by executing, by a processor in a memory device, a program and/or instructions loaded in a memory in the memory device. However, the segment look-up table 234 is not limited to the embodiments described above, and in some embodiments the segment look-up table 234 may be implemented in a form combining software and hardware.

Figure 9:
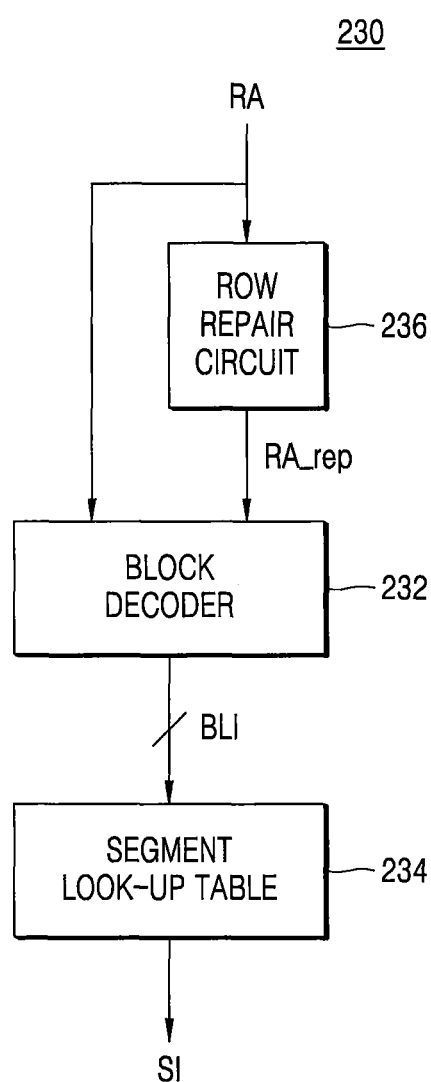
FIG. 9 is a block diagram of a segment selection circuit according to some embodiments of the inventive concepts.

FIG. 9 is a block diagram of the segment selection circuit 230 according to some embodiments of the inventive concepts. Previous description of the segment selection circuit 230 made with reference to FIGS. 1, 2, and 8 is not repeated herein for brevity, and differences in FIG. 9 as compared to FIG. 8 will be mainly described.

The segment selection circuit 230 may include the block decoder 232, the segment look-up table 234, and a row repair circuit 236.

In the present specification, a repair operation is mainly used for a column repair operation, but in some embodiments the repair operation may include a column repair operation and a row repair operation. For example, when a memory cell connected to a word line is defective, a repair operation may be performed using a spare word line, and such a repair operation may be referred to as a row repair operation.

The row repair circuit 236 may perform an operation of replacing a word line to which a defective cell is connected with a spare word line. In other words, the row repair circuit 236 may output a repaired row address RA_rep based on an input row address RA. To this end, according to some embodiments of the inventive concepts, the row repair circuit 236 may store a table in which a row address to which a defective cell is connected is matched with a repaired row address. The row repair circuit 236 may provide the repaired row address RA_rep to the block decoder 232.

The block decoder 232 may output block information BLI based on at least one of the input row address RA and the repaired row address RA_rep. For example, the block decoder 232 may output the block information BLI by decoding at least one of the input row address RA and the repaired row address RA_rep.

The segment look-up table 234 may output segment information SI based on the block information BLI.

FIG. 10 is a logic diagram of the segment look-up table 234 according to some embodiments of the inventive concepts. Particularly, FIG. 10 shows an embodiment in which the segment look-up table 234 is implemented in hardware. In addition, for convenience of description, FIG. 10 shows an embodiment in which memory regions are grouped as shown in FIG. 5. FIG. 10 is described with reference to FIG. 5, and it is assumed that each of the plurality of memory regions in FIG. 5 is a memory block, though the present disclosure is not limited thereto.

Block information BLI may include pieces of block information respectively corresponding to the plurality of memory blocks. When each of the pieces of block information indicates a first logic level (e.g., '1'), a memory block corresponding to corresponding block information may include a selected word line. On the contrary, when each of the pieces of block information indicates a second logic level (e.g., '0'), a memory block corresponding to corresponding block information may not include a selected word line.

The segment look-up table 234 may include a plurality of OR logic gates, e.g., first to seventh OR logic gates 234_1 to 234_7, not all of which are shown in FIG. 10. Each of the plurality of OR logic gates 234_1 to 234_7 may correspond to one segment. For example, the first OR logic gate 234_1 may correspond to the first segment SEG1, the second OR logic gate 234_2 may correspond to the second segment SEG2, the third OR logic gate 234_3 may correspond to the third segment SEG3, the fourth OR logic gate 234_4 may correspond to the fourth segment SEG4, the fifth OR logic gate 234_5 may correspond to the fifth segment SEG5, the sixth OR logic gate 234_6 may correspond to the sixth segment SEG6, and the seventh OR logic gate 234_7 may correspond to the seventh segment SEG7.

Each of the plurality of OR logic gates 234_1 to 234_7 may receive, as inputs, pieces of block information corresponding to memory regions included in a corresponding segment. For example, the first OR logic gate 234_1 may receive, as inputs, block information BLI_FE corresponding to the first edge memory region, block information BLI_C corresponding to the center memory region, and block information BLI_SE corresponding to the second edge memory region, and output first segment information SI_1 by performing an OR operation. Likewise, for example, the second OR logic gate 234_2 may receive, as inputs, block information BLI_L_1 corresponding to the intermediate memory region IMG_L_1, block information BLI_L_2 corresponding to the intermediate memory region IMG_L_2, and block information BLI_L_3 corresponding to the intermediate memory region IMG_L_3, and output second segment information SI_2 by performing an OR operation. In the same manner as described above, the third to seventh logic gates 234_3 to 234_7 may also be understood.

Several example situations are discussed to assist in understanding the operation of the segment look-up table 234.

In a first example, it is assumed that a selected word line is included in the second edge memory region. In this case, by a decoding operation of the block decoder 232 in FIGS. 8 and 9, only the block information BLI_SE corresponding to the second edge memory region indicates the first logic level (e.g., '1'), and the pieces of block information corresponding to the remaining memory regions may have the second logic level (e.g., '0'). Accordingly, the first OR logic gate 234_1 may output the first segment information SI_1 at the first logic level by performing an OR operation. However, the remaining OR logic gates 234_2 to 234_7 may output pieces of segment information SI_2 to SI_7 at the second logic level by performing OR operations.

In a second example, it is assumed that a selected word line is included in the intermediate memory region IMG_L_8. In this case, by a decoding operation of the block decoder 232 in FIGS. 8 and 9, only the block information BLI_L_8 corresponding to the intermediate memory region IMG_L_8 indicates the first logic level (e.g., '1'), and the pieces of block information corresponding to the remaining memory regions may have the second logic level (e.g., '0'). Accordingly, the fourth OR logic gate 234_4 may output the fourth segment information SI_4 at the first logic level by performing an OR operation. However, the remaining OR logic gates 234_1 to 234_3 and 234_5 to 234_7 may output pieces of segment information SI_1 to SI_3 and SI_5 to SI_7 at the second logic level by performing OR operations.

Figure 11:
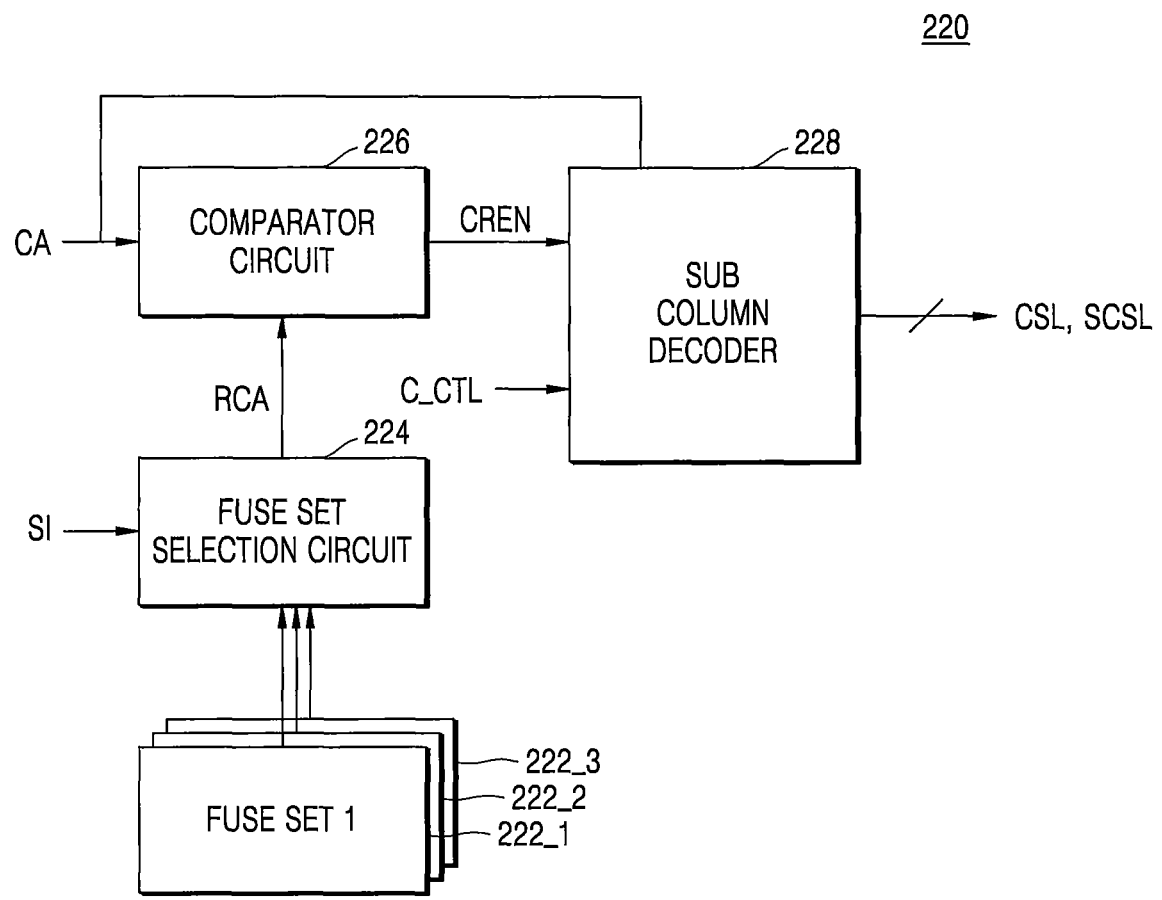
FIG. 11 is a block diagram of a repair circuit according to some embodiments of the inventive concepts.

FIG. 11 is a block diagram of the repair circuit 220 according to some embodiments of the inventive concepts. Previous description of the repair circuit 220 made with reference to FIGS. 1 and 2 is not repeated herein for brevity.

The repair circuit 220 may include a plurality of fuse sets 222_1, 222_2, and 222_3, a fuse set selection circuit 224, a comparator circuit 226, and a sub-column decoder 228.

Although FIG. 11 shows that the plurality of fuse sets 222_1, 222_2, and 222_3 includes three fuse sets, this is only illustrative, and the number of fuse sets is not limited thereto. According to some embodiment of the inventive concepts, the plurality of fuse sets 222_1, 222_2, and 222_3 may include a number of fuse sets corresponding to the number of segments. Each of the plurality of fuse sets 222_1, 222_2, and 222_3 may store a repair column address corresponding to a defective memory cell. Each of the plurality of fuse sets 222_1, 222_2, and 222_3 may include a plurality of fuses. For example, the fuse may be implemented by various nonvolatile memories such as an electrically programmable fuse, a laser programmable fuse, an anti-fuse, and/or a flash memory.

The fuse set selection circuit 224 may select at least one fuse set among the plurality of fuse sets 222_1, 222_2, and 222_3 based on segment information SI. For example, the fuse set selection circuit 224 may select a fuse set corresponding to the segment information SI. The fuse set selection circuit 224 may provide to the comparator circuit 226 a repair column address RCA corresponding to the selected fuse set.

The comparator circuit 226 may output a repair enable signal CREN by comparing the repair column address RCA with an input column address CA. The repair enable signal CREN may indicate whether a bit line corresponding to the input column address CA has been repaired. The comparator circuit 226 may provide the repair enable signal CREN to the sub-column decoder 228.

The sub-column decoder 228 may select at least one of a plurality of column select lines CSL and spare column select lines SCSL based on the repair enable signal CREN, the input column address CA, and a column control signal C_CTL.

Figure 12:
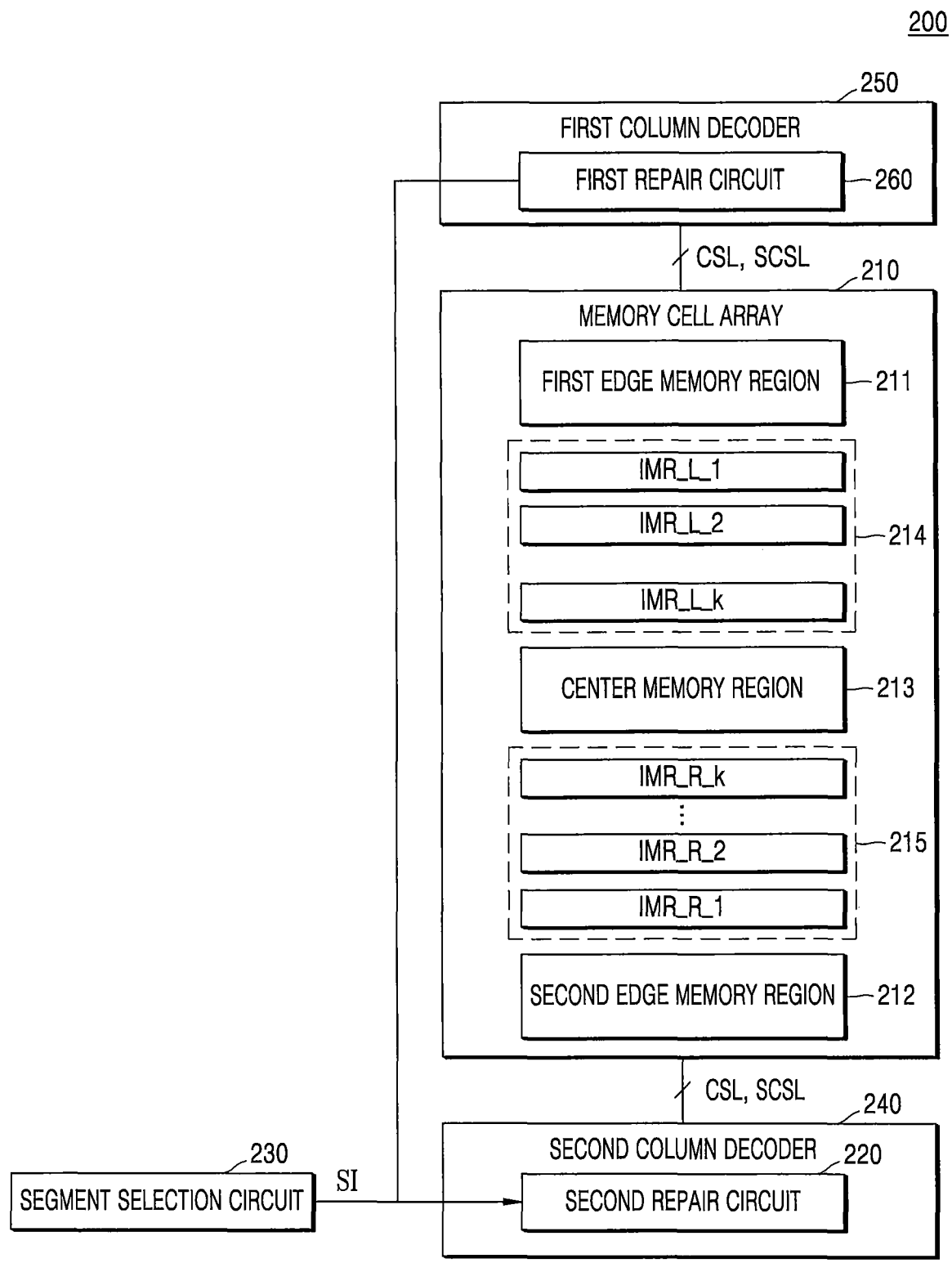
FIG. 12 is a block diagram of a memory device according to some embodiments of the inventive concepts.

FIG. 12 is a block diagram of a memory device 200 according to some embodiments of the inventive concepts. Differences in FIG. 12 from FIG. 2 with respect to the memory device 200 will be mainly described.

The memory device 200 may include a plurality of column decoders. For example, the memory device 200 may include a first column decoder 250 and a second column decoder 240.

The first column decoder 250 may be located in a first direction from the memory cell array 210, and the second column decoder 240 may be located in a second direction from the memory cell array 210. Herein, the first direction may be opposite to the second direction. In other words, the first column decoder 250 and the second column decoder 240 may be located on opposite sides of the memory cell array 210.

The first column decoder 250 may include a first repair circuit 260. The first repair circuit 260 may operate substantially in the same manner as the repair circuit 220 described with reference to FIGS. 1 to 3 and 5 to 11. However, the first repair circuit 260 may perform a repair operation on the center memory region 213 and on memory regions located in the first direction from the center memory region 213. For example, the first repair circuit 260 may perform a repair operation on the first edge memory region 211, the first intermediate memory regions 214, and the center memory region 213.

The second column decoder 240 may include a second repair circuit 220. The second repair circuit 220 may operate substantially in the same manner as the repair circuit 220 described with reference to FIGS. 1 to 3 and 5 to 11. However, the second repair circuit 220 may perform a repair operation on the center memory region 213 and on memory regions located in the second direction from the center memory region 213. For example, the second repair circuit 220 may perform a repair operation on the second edge memory region 212, the second intermediate memory regions 215, and the center memory region 213.

In addition, as described with reference to the drawings above, the first edge memory region 211, the second edge memory region 212, and the center memory region 213 may be grouped into a first segment, and according to some embodiments of the inventive concepts, fuse information corresponding to the first segment may be stored in both the first repair circuit 260 and the second repair circuit 220.

Because the memory device 200 according to some embodiments of the inventive concept includes the first column decoder 250 and the second column decoder 240 in the first and second directions, respectively, a decrease in a speed may be prevented regardless of an increase in the number of memory blocks included in the memory device 200.

Figure 13:
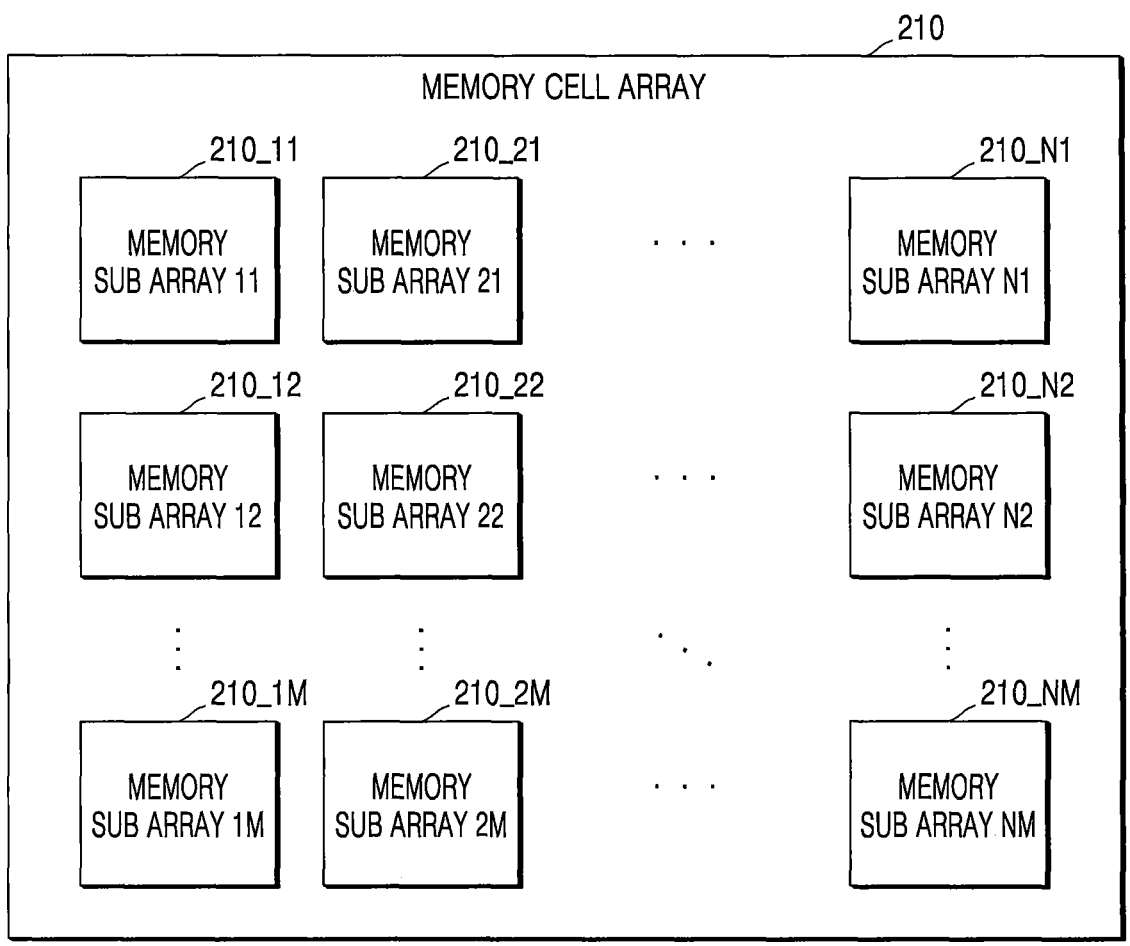
FIG. 13 is a block diagram of a memory cell array according to some embodiments of the inventive concepts.

FIG. 13 is a block diagram of a memory cell array 210 according to some embodiments of the inventive concepts.

Along with an increase in the size of the memory cell array 210, the memory cell array 210 may include a plurality of memory sub-arrays 210_11 to 210_NM. For example, the memory cell array 210 may include the plurality of memory sub-arrays 210_11 to 210_NM in M rows and N columns (M and N are natural numbers).

According to the memory cell array 210 according to some embodiments of the inventive concepts, each of the plurality of memory sub-arrays 210_11 to 210_NM may be controlled in the same manner as the memory cell array 210 described with reference to FIGS. 1 to 3 and 5 to 12.

Figure 14:
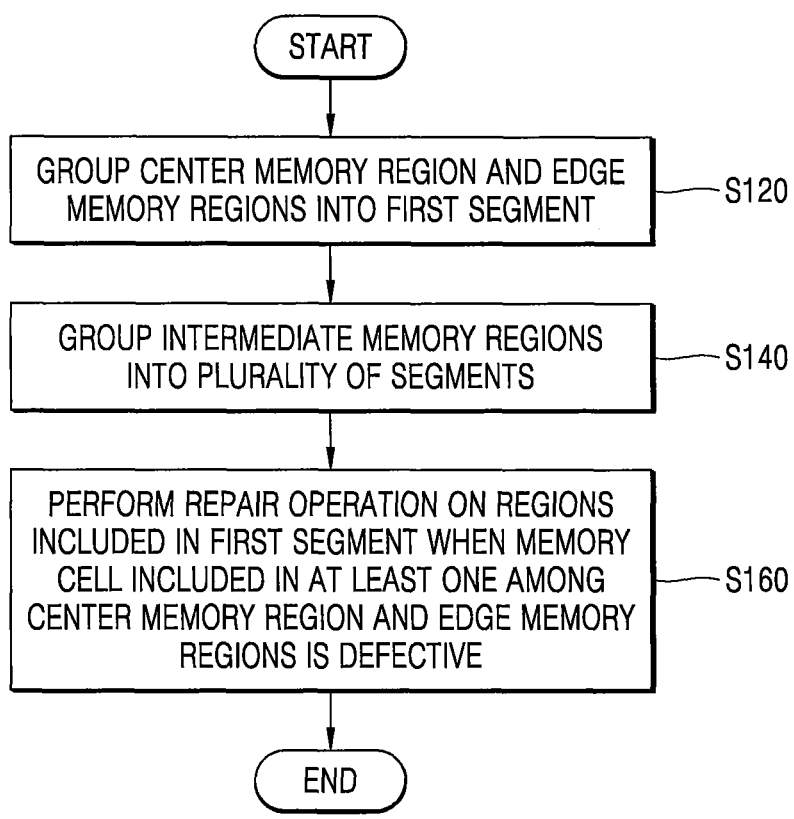
FIG. 14 is a flowchart of a repair operation method of a memory device, according to some embodiments of the inventive concepts.

FIG. 14 is a flowchart of a repair operation method of a memory device, according to some embodiments of the inventive concepts. FIG. 14 is described with reference to FIG. 2.

In operation S120, the memory device 200 may group the center memory region 213 and the first and second edge memory regions 211 and 212 into a first segment. For example, the segment selection circuit 230 may group the first edge memory region 211, the second edge memory region 212, and the center memory region 213 into the first segment.

In operation S140, the memory device 200 may group intermediate memory regions into a plurality of segments. The intermediate memory regions may be memory regions of a memory cell array 210 or of a plurality of memory regions other than the center memory region 213 and the first and second edge memory regions 211 and 212. Embodiments of operation S140 have been described in detail with reference to FIGS. 5 to 7, and thus, operation S140 will be understood with reference to FIGS. 5 to 7.

In operation S160, the memory device 200 may perform a column repair operation on each of the regions included in the first segment when a memory cell included in at least one of the center memory region 213 and the first and second edge memory regions 211 and 212 is determined to be defective.

In some embodiments, if a cell included in a first memory block included in the intermediate memory blocks is defective, the memory device 200 may simultaneously perform a column repair operation on the first memory block and on a pre-defined number of memory blocks adjacent to the first memory block. The pre-defined number may be a number of memory blocks included in one segment. As a non-restrictive example, the pre-defined number may be 3 in the description with reference to FIGS. 5 to 6C, and the pre-defined number may be 5 in the description with reference to FIG. 7.

While the inventive concepts have been particularly shown and described with reference to embodiments thereof, it will be understood that various changes in form and details may be made therein without departing from the scope of the following claims.

What is claimed is:

1. A memory device comprising:
a memory cell array including a plurality of memory regions, wherein the plurality of memory regions includes a first edge memory region including a first edge word line, a second edge memory region including a second edge word line, and a center memory region including a center word line;
a segment selection circuit configured to select a target segment from among a plurality of segments based on an input row address and configured to output segment information identifying the target segment, wherein the edge memory regions and the center memory region are grouped into a first segment of the plurality of segments; and
a column decoder configured to control a column repair operation performed on a segment basis based on at least one fuse set, wherein the at least one fuse set is selected based on the segment information, the column decoder further configured to perform the column repair operation for the first segment based on detecting a defective cell included in at least one of the edge memory regions and the center memory region.

2. The memory device in claim 1, wherein the plurality of memory regions includes a plurality of intermediate memory regions, and wherein the plurality of segments includes a plurality of second segments each including at least one of the plurality of intermediate memory regions.

3. The memory device in claim 2, wherein the first segment and each of the plurality of second segments include an equal number of word lines.

4. The memory device in claim 2, wherein at least one of the plurality of second segments includes a different number of word lines than a number of word lines included in the first segment.

5. The memory device in claim 1, wherein the segment selection circuit comprises:
a block decoder configured to output, based on the input row address, block information including information about a memory block including a selected word line; and
a segment look-up table configured to output, based on the block information, the segment information identifying the target segment, wherein the segment information identifying the target segment includes the selected word line.

6. The memory device in claim 5, wherein the segment selection circuit further comprises a row repair circuit configured to output a repaired row address based on the input row address, and wherein the block decoder is further configured to output the block information based on at least one among the input row address and the repaired row address.

7. The memory device in claim 5, wherein the segment selection circuit comprises a plurality of OR logic gates, each of the OR logic gates respectively corresponding to a segment of the plurality of segments, wherein each OR logic gate is configured to output a signal indicating whether the selected word line is included in the respectively corresponding segment.

8. The memory device in claim 1, wherein the column decoder comprises a repair circuit configured to control the column repair operation based on the segment information and a column address.

9. The memory device in claim 8, wherein the repair circuit comprises:
a fuse set selection circuit configured to select one of a plurality of fuse sets based on the segment information;
a comparator circuit configured to output a repair enable signal by comparing an input column address with a repaired column address included in the selected fuse set; and
a sub-column decoder configured to select at least one of a plurality of column select lines or at least one of a plurality of spare column select lines based on the input column address and a column control signal.

10. The memory device in claim 1, wherein the column decoder is a first column decoder located adjacent to the first edge memory region; and wherein the memory device further comprises a second column decoder located adjacent to the second edge memory region.

11. The memory device in claim 10, wherein the first column decoder and the second column decoder each store a fuse set corresponding to the first segment.

12. A memory device comprising:
a memory cell array including a plurality of memory regions;
a first column decoder on a first side of the memory cell array; and
a second column decoder on a second side of the memory cell array opposite from the first side,
wherein the plurality of memory regions comprise:
a first edge memory region nearest to the first column decoder;
a second memory region nearest to the second column decoder; and
a center memory region located between the first edge memory region and the second memory region at a center of the memory cell array, and
wherein the first column decoder and the second column decoder are each configured to repair a bit line connected to the first edge memory region, the second memory region, and the center memory region to a spare bit line based on detecting that a memory cell included in at least one of the first edge memory region, the second memory region, or the center memory region is defective.

13. The memory device in claim 12, wherein the first column decoder comprises a first repair circuit configured to control a column repair operation on the center memory region and a plurality of first memory regions located in the memory cell array between the center memory region and the first edge memory region, and wherein the second column decoder comprises a second repair circuit configured to control a column repair operation on the center memory region and a plurality of second memory regions located in the memory cell array between the center memory region and the second edge memory region.

14. The memory device in claim 12, further comprising a segment selection circuit configured to output segment information identifying a target segment to the first column decoder and to the second column decoder responsive to selecting the target segment from among a plurality of segments based on an input row address,
wherein the first column decoder and the second column decoder are each configured to selectively perform a column repair operation on a segment basis based on the segment information, and wherein the plurality of segments include a first segment including the first edge memory region, the second edge memory region, and the center memory region.

15. The memory device in claim 14, wherein the segment selection circuit comprises:

a block decoder configured to output, based on an input row address, block information including information about a memory block including a selected word line; and a segment look-up table configured to output, based on the block information, the segment information identifying the target segment, wherein the segment information includes the selected word line.

16. The memory device in claim 15, wherein the segment selection circuit further comprises a row repair circuit configured to output a repaired row address based on the input row address, and wherein the block decoder is further configured to output the block information based on at least one of the input row address and the repaired row address.

17. The memory device in claim 14, wherein the plurality of memory regions further include a plurality of intermediate memory regions, and wherein the plurality of segments further include a plurality of second segments each including at least one of the plurality of intermediate memory regions.

18. The memory device in claim 12, wherein the memory cell array has an open bit line structure.

19. A memory device comprising:

a memory cell array comprising a plurality of memory blocks including a first number of memory blocks;

a segment selection circuit configured to group the plurality of memory blocks into a plurality of segments including a second number of segments, wherein the second number is less than the first number, and wherein the segment selection circuit is configured to select, based on an input row address, a target segment from among the plurality of segments and output segment information identifying the target segment; and a repair circuit configured to control a column repair operation on a segment basis using at least one fuse set corresponding to the segment information, wherein the segment selection circuit is further configured to group into a first segment a first memory block and a second memory block non-adjacent to each other within the memory cell array.

20. The memory device in claim 19, wherein the segment selection circuit is further configured to group into the first segment first and second edge memory blocks respectively including first and second edge word lines, and a center memory block including a center word line.

* * * * *